US009818368B2

(12) United States Patent
Wu

(10) Patent No.: US 9,818,368 B2
(45) Date of Patent: Nov. 14, 2017

(54) PIXEL STRUCTURE AND CONTROL METHOD THEREOF AND DISPLAY PANEL

(71) Applicant: BOE TECHNOLOGY GROUP CO., LTD., Beijing (CN)

(72) Inventor: Yanbing Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 159 days.

(21) Appl. No.: 13/703,576

(22) PCT Filed: Sep. 19, 2012

(86) PCT No.: PCT/CN2012/081607
§ 371 (c)(1),
(2) Date: Dec. 11, 2012

(87) PCT Pub. No.: WO2013/056611
PCT Pub. Date: Apr. 25, 2013

(65) Prior Publication Data
US 2014/0062977 A1 Mar. 6, 2014

(30) Foreign Application Priority Data
Oct. 18, 2011 (CN) .......................... 2011 1 0317219

(51) Int. Cl.
G09G 5/00 (2006.01)
H04N 13/04 (2006.01)
(Continued)

(52) U.S. Cl.
CPC ........... G09G 5/00 (2013.01); G02B 27/2264 (2013.01); G02B 27/26 (2013.01); G09G 3/003 (2013.01);
(Continued)

(58) Field of Classification Search
CPC .... G02B 27/2214; G02B 27/26; G02B 27/22; H04N 13/0409; H04N 13/0404
(Continued)

(56) References Cited

U.S. PATENT DOCUMENTS

2005/0001787 A1  1/2005  Montgomery et al.
2005/0200788 A1  9/2005  Edwards
(Continued)

FOREIGN PATENT DOCUMENTS

CN    1908791 A    2/2007
CN    101387775 A   3/2009
(Continued)

OTHER PUBLICATIONS

International Preliminary Report on Patenability dated Apr. 22, 2014; PCT/CN2012/081607.
(Continued)

Primary Examiner — Koosha Sharifi-Tafreshi
(74) Attorney, Agent, or Firm — Ladas & Parry LLP

(57) ABSTRACT

Embodiments of the present invention provide a pixel structure and a control method thereof and a display panel. The pixel structure comprises a plurality of sub-pixels, and a plurality of gate lines and a plurality of data lines that are crossed with each other, wherein the gate lines comprise a plurality of first gate lines and a plurality of second gate lines, each sub-pixel comprises a first part and a second part, and each sub-pixel comprises a first thin film transistor and a second thin film transistor, the first part is connected to a corresponding data line through the first thin film transistor, a gate of the first film transistor is connected to a corresponding first gate line, the first part and the second part of each sub-pixel are connected with each other through the second thin film transistor, and a gate of the second film transistor is connected to a corresponding second gate line.

7 Claims, 3 Drawing Sheets

(51) Int. Cl.
*G02B 27/22* (2006.01)
*G02B 27/26* (2006.01)
*G09G 3/00* (2006.01)
*G09G 3/36* (2006.01)
*H01L 29/786* (2006.01)
*G02F 1/1343* (2006.01)

(52) U.S. Cl.
CPC ......... *G09G 3/3659* (2013.01); *H01L 29/786* (2013.01); *H04N 13/0434* (2013.01); *H04N 13/0454* (2013.01); *G02F 2001/134345* (2013.01); *G09G 2300/0443* (2013.01)

(58) Field of Classification Search
USPC ................ 345/204, 211; 349/15; 348/51; 359/462, 463
See application file for complete search history.

(56) References Cited

U.S. PATENT DOCUMENTS

| | | | |
|---|---|---|---|
| 2008/0012807 | A1 | 1/2008 | Chiang et al. |
| 2008/0074371 | A1 | 3/2008 | Tajiri |
| 2008/0309663 | A1 | 12/2008 | Fukushima et al. |
| 2009/0237343 | A1 | 9/2009 | Shibazaki et al. |
| 2010/0265230 | A1 | 10/2010 | Kang |
| 2010/0289884 | A1 | 11/2010 | Kang |
| 2011/0128269 | A1* | 6/2011 | Lee et al. ............... 345/211 |
| 2011/0134231 | A1* | 6/2011 | Hulvey et al. ............ 348/56 |
| 2011/0175873 | A1 | 7/2011 | Miyake |
| 2011/0216177 | A1 | 9/2011 | Chae et al. |
| 2011/0227886 | A1* | 9/2011 | Lee et al. ............... 345/204 |
| 2012/0105735 | A1 | 5/2012 | Tsubata |

FOREIGN PATENT DOCUMENTS

| | | |
|---|---|---|
| CN | 101526710 A | 9/2009 |
| CN | 101867836 A | 10/2010 |
| CN | 101888564 A | 11/2010 |
| CN | 102081911 A | 6/2011 |
| JP | 0353218 A | 3/1991 |
| JP | 2005-018073 A | 1/2005 |
| JP | 2005-316126 A | 11/2005 |
| JP | 2007-293158 A | 11/2007 |
| JP | 2008-076958 A | 4/2008 |
| JP | 2009-229707 A | 10/2009 |
| JP | 2010-152223 A | 7/2010 |
| JP | 2011-170332 A | 9/2011 |
| KR | I 20100115036 A | 10/2010 |
| KR | 20110060272 A | 6/2011 |
| WO | 2011/010417 A1 | 1/2011 |

OTHER PUBLICATIONS

First Chinese Office Action dated Mar. 6, 2014; Appl. No. 201110317219.0
Korea Office Action dated Nov. 25, 2013; Appln. No. 10-2012-7032309.
International Search Report dated Dec. 13, 2012; PCT/CN2012/081607.
KIPO Notice of Allowance dated May 30, 2014; Appln. No. 10-2012-7032309.
Japanese Office Action dated May 30, 2016; Appln. No. 2014-536099.
Office Action from the European Patent Office dated Aug. 25, 2016; Appln. No. 12 791 416.6-1903.
Extended European Search Report dated Oct. 28, 2014: Appln No. 12791416.6-1903/2620810 PCTICN2012081607.
EPO Office Action dated Oct. 7, 2015; Appln. No. 12 791 416.6-1903.
Japanese Office Action dated Feb. 6, 2017; Appln. No. 2014-536099.

* cited by examiner

PIXEL STRUCTURE AND CONTROL METHOD THEREOF AND DISPLAY PANEL

CROSS REFERENCE TO RELATED APPLICATIONS

This application is a national stage application under 35 U.S.C. 371 and claims the benefit of PCT Application No. PCT/CN2012/081607 having an international filing date of Sep. 19, 2012, which designated the United States, which PCT application claimed the benefit of Chinese Application No. 201110317219.0 filed Oct. 18, 2011, the disclosure of each of which are incorporated herein by reference.

FIELD OF THE INVENTION

Embodiments of the present invention relate to a pixel structure which is used in a stereoscopic display device, a control method thereof, and a display panel with the pixel structure.

BACKGROUND

Stereoscopic display has become a major trend in display field. Basic principle of stereoscopic display is to produce stereoscopic sensation by applying parallax, i.e., make one's left eye see a left-eye picture and right eye see a right-eye picture, where the left-eye picture and the right-eye picture here are a stereoscopic picture pair with parallax.

One way to realize a stereoscopic sensation is to adopt serial display, i.e., at a first moment, a display device displays a left-eye image and only left eye of a watcher is allowed to see the display image; at a second moment, the display device displays a right-eye image and only right eye of the watcher is allowed to see the display image. By utilizing image persistence of one's eye retina, it makes one to feel that both the left and right eye see the left-eye image and right-eye image simultaneously, thereby the stereoscopic sensation is produced.

Another way of realizing the stereoscopic sensation is parallel display, i.e., at the same moment, part of pixels on a display device display content of a left-eye image, and part of pixels display content of a right-eye image. By means of gratings, polarized glasses and the like, the display on one part of pixels can only be seen by right eye, and that on the other part can only be seen by left eye, and thereby the stereoscopic sensation is produced.

Stereoscopic display of polarized glasses type is a major technology in current stereoscopic display field, the basic structure of which is that a device which can adjust polarization direction of emitting light is installed in front of a display panel. The device may be a pattern retarder, and may also be a liquid crystal cell, or other devices that can adjust polarization direction of emitting lights of different pixels. The principle of stereoscopic display by pattern retarder is as shown in FIG. 2. Right-eye images and left-eye images are respectively displayed on every other line on a display panel, and a pattern retarder is placed in front of the display panel, wherein a structure with λ/2 delay for one line and no delay for the other line is repeated, which makes the polarization direction of emitting light of pixels with λ/2 delay rotate 90 degrees. Therefore, wearing polarized glasses with orthogonal polarization directions for the left-eye and the right-eye enables the right eye to see only light emitted from right-eye pixels and enables the left eye to see only light emitted from the left-eye pixels, and thereby a stereoscopic effect is produced.

During various stereoscopic displays by polarized glasses, the technology adopting the pattern retarder is the most preferable. Its basic structure is that a pattern retarder is attached to a display panel with accurate alignment, and different phase retardations are produced by different regions of the pattern retarder, and thereby allowing light of different pixels to be emitted along different polarization directions. A watcher may watch a 3D effect through polarized glasses.

However, the greatest weakness of the above-mentioned 3D display is that a view angle along a vertical direction is very small. FIG. 3 illustrates the principle of the limited viewing angle. In FIG. 3, "a" is the height of a pixel display region, "b" is the width of a black matrix (BM) in the vertical direction, "h" is the distance between a pattern retarder to a display panel, "c" is the width of a strip on the pattern retarder, "θ" is the 3D viewing angle, and "p" is the size of a pixel, wherein p=a+b and p is a constant. In FIG. 3, only region "d" can achieve a good 3D effect, wherein the angle "θ" is a key parameter.

By geometry calculation according to the above-mentioned simplified mathematical model, it is obtained that the 3D viewing angle "θ" meets an equation (1):

$$\tan\frac{\theta}{2} = \frac{a+2b-c}{2h} \qquad (1)$$

It can be seen that "θ" increases as the width "b" of the black matrix (blocking bar) increases. As shown in FIG. 4(b), a design of active black matrix (Active BM) has been proposed accordingly. In a structure of active black matrix in FIG. 4(b), which is different from the ordinary pixel structure shown in FIG. 4(a), an original sub-pixel is divided into an upper part and a lower part (for simplicity, they are referred to Part A and Part B herein) for separate control, where in 2D display model, A and B pixels display the same content; and in 3D display model, B pixels display in black, which is equivalent to increasing the BM width (b) of the original pixels, and thereby a 3D viewing angle "θ" is enlarged.

A conventional control method for an active black matrix display panel is to regard Part B as an independent pixel for controlling, thus double gate lines and double data lines comparing with those in the original display panel are needed, and therefore cost and complexity for control are greatly increased.

SUMMARY

One embodiment of the present invention provides a pixel structure, comprises a plurality of sub-pixels, and a plurality of gate lines and a plurality of data lines that are crossed with each other, wherein the gate lines comprise a plurality of first gate lines and a plurality of second gate lines, each sub-pixel comprises a first part and a second part, and each sub-pixel comprises a first thin film transistor and a second thin film transistor, the first part is connected to a corresponding data line through the first thin film transistor, a gate of the first film transistor is connected to a corresponding first gate line, the first part and the second part of each sub-pixel are connected with each other through the second thin film transistor, and a gate of the second film transistor is connected to a corresponding second gate line.

Another embodiment of the present invention provides a control method of the pixel structure, comprising: in a planar display mode, a higher level is provided through the second gate line to turn on the second thin film transistor in each sub-pixel, so as to enable the first part and the second part of each sub-pixel to display the same content input from the data lines; upon switch from the planar display mode to a stereoscopic display mode, a black image is provided through the data lines, so that the first part and the second part of each sub-pixel display black; and in the stereoscopic display mode, a lower level is provided through the second gate line to turn off the second thin film transistor of each sub-pixel, so as to enable the first part of each sub-pixel to display content input from the data lines, while the second part keeps displaying black.

Another embodiment of the present invention provides a display panel comprising the above-mentioned pixel structure, wherein the plurality of sub-pixels are arranged in a matrix, and the first parts and the second parts of the plurality of sub-pixels are respectively arranged in rows, and the rows consisting of the first parts are alternatively arranged with the rows consisting of the second parts.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
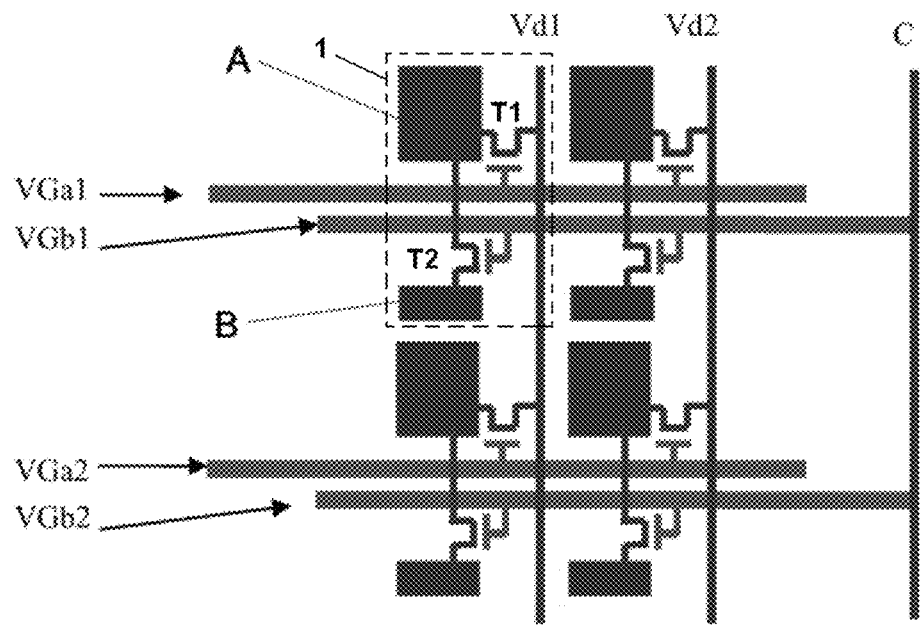
FIG. 1 is a schematic diagram of a pixel structure according to an embodiment of the present invention.
Figure 2:
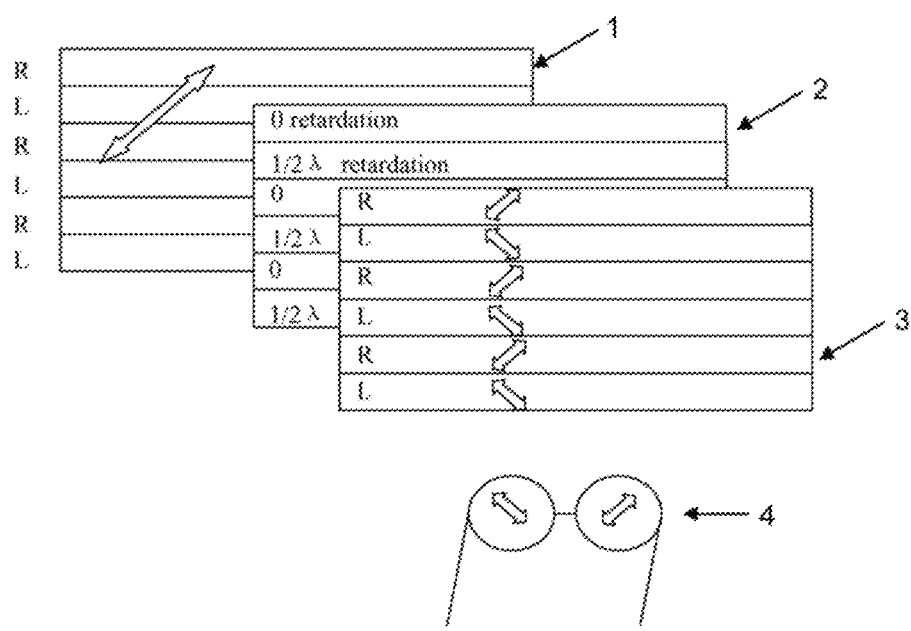
FIG. 2 is a view showing stereoscopic display realized by a pattern retarder in the prior art.
Figure 3:
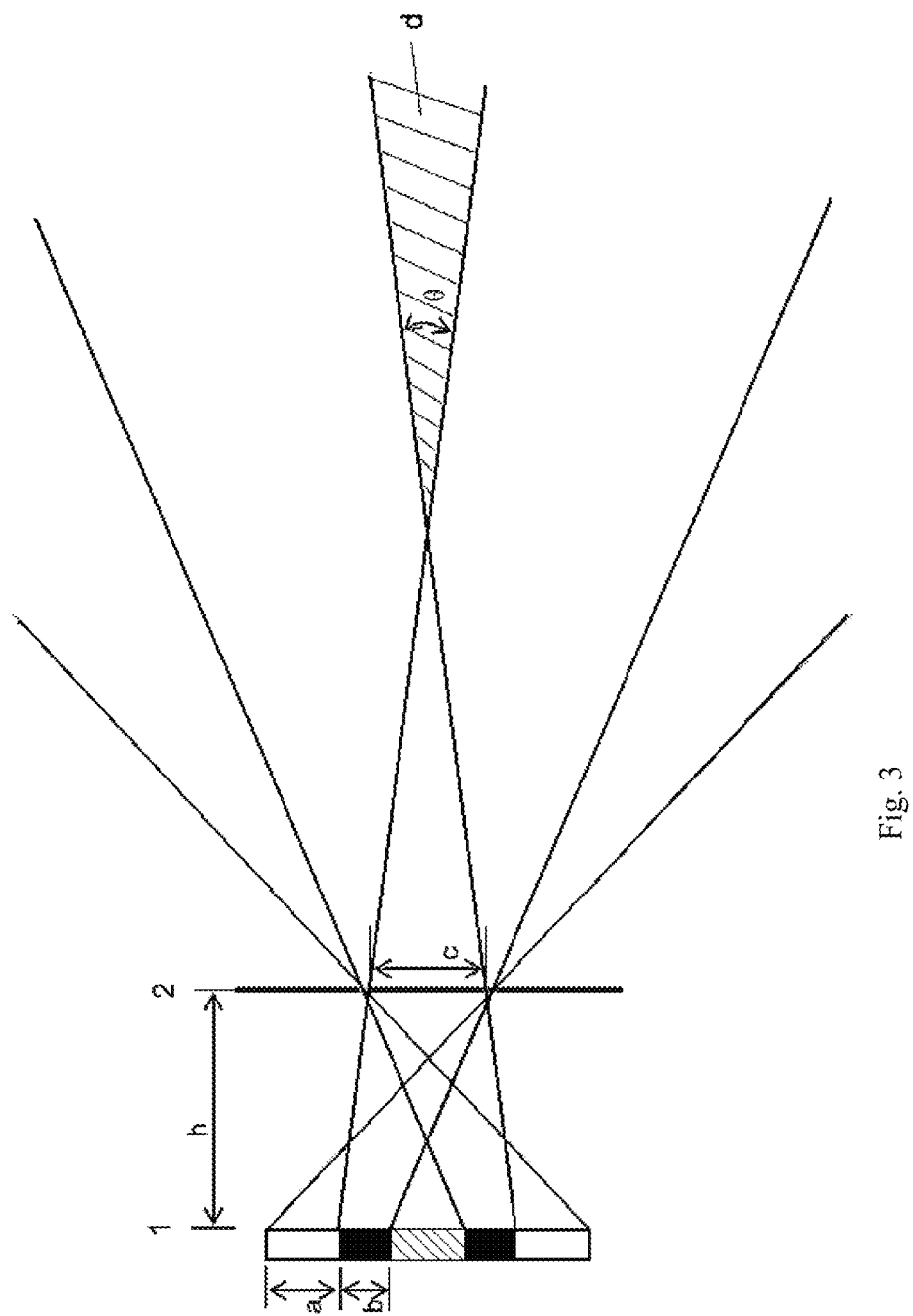
FIG. 3 is a view showing a limit on a angle for stereoscopic display in the prior art.
Figure 4:
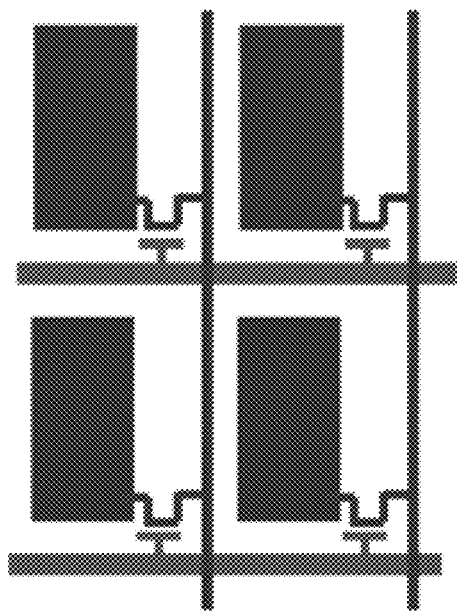
FIG. 4(a) is a schematic diagram of an ordinary pixel structure in the prior art.
FIG. 4(b) is a schematic diagram of an active black matrix pixel structure in the prior art.
Figure 4B:
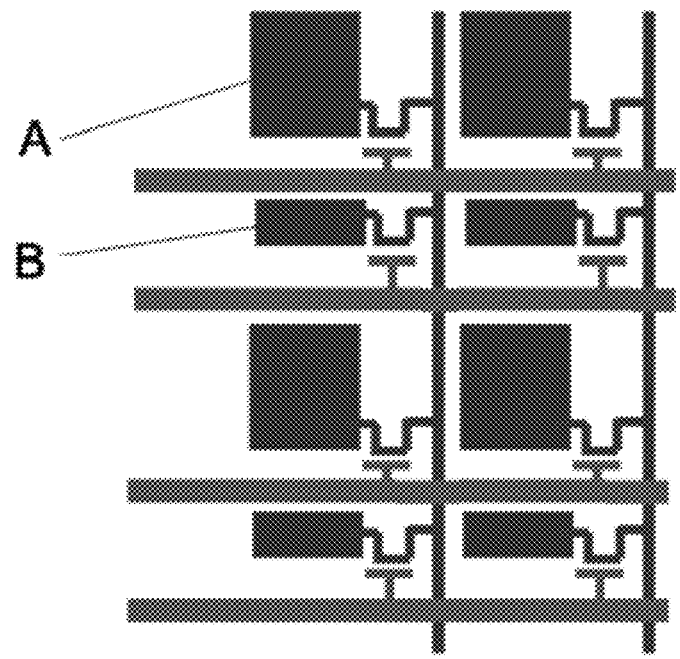

As shown in FIG. 1, a pixel structure according to an embodiment of the present invention comprises a plurality of sub-pixels 1. Each sub-pixel 1 comprises two parts, i.e., a first part (Part A) and a second part (Part B), and is configured with a first thin film transistor (TFT) T1 and a second thin film transistor T2. In addition, the pixel structure further comprises a plurality of data lines (Vd1/Vd2) and a plurality of gate lines (VGa1/VGa2/VGb1/VGb2) that are crossed with each other. The gate lines comprise first gate lines VGa1/VGa2 and second gate lines VGb1/VGb2. The first part (Part A) is connected to a corresponding data line Vd1/Vd2 through the first TFT (for example, the source electrode of the first TFT is connected with the data line and the drain electrode of the second TFT is connected with the first part), and the gate of the first TFT is connected to a corresponding first gate line VGa1/VGa2. The second part (Part B) is connected with the first part (Part A) through the second TFT (for example, the source electrode of the second TFT is connected with the first part and the drain electrode of the second TFT is connected with the second part), and the gate of the second TFT is connected to a corresponding second gate line VGb1/VGb2. All of the second gate lines VGb1/VGb2 which are used for the second part (Part B) may be connected with one another through a circuit C.

In one embodiment, the first part and the second part of the sub-pixel each comprise a pixel electrode. The pixel electrode of the first part is connected to the data line through the first TFT, and the pixel electrode of the second part is connected to the pixel electrode of the first part through the second TFT. When display is performed, the pixel electrodes are driving electrodes of the pixels, and can drive the respective parts of corresponding pixels to display images or display black. Therefore, the pixel structure according to the embodiment of the present invention can form an active black matrix structure. More details about the control method are described below.

In one embodiment, each of the sub-pixels has a structure of normal black mode. That is to say, when a drive voltage or a display signal is not applied to the pixels, the pixels display black.

The pixel structure shown in FIG. 1 may perform a planar display or a stereoscopic display. For example, a control method of the pixel structure is as follows.

In a planar display mode, the gate lines for the Part A (the first gate lines) of the respective sub-pixels are input with a higher level successively. As a result, the first TFT is turned on and enables a data signal for display is input through the data lines to Part A. When the first gate is scanned, the circuit C is always input with a higher level, therefore, all of the second gate lines VGb1/VGb2 are provided with a higher level and makes the second TFT connecting Part A and Part B to be turned on. Therefore, data signals transmitted to Part A may also be transmitted to Part B through the second TFT, which makes Part A and Part B display the same content.

Upon switch from the planar display mode to the stereoscopic display mode, a black image is inserted into the last frame of images of the planar display mode, making both Part A and Part B display black.

Then the circuit C is input with a lower level to make the second TFT turned off, while Part A still keeps working in the manner as that in the planar display mode. As the second TFT has been turned off, signals from Part A cannot enter Part B, and Part B keeps displaying black. In this case, Part B may function as a black matrix (blocking bar).

Preferably, the control method according to the embodiment of the present invention is used in a normal black mode. In the normal black mode, since a black image is displayed without electric field application, when the gate line is input with a lower voltage, the TFT for Part B is turned off, therefore no display signal is applied to part B and black is displayed. On the contrary, if in a normal white mode, the highest pixel voltage is needed to display a black image. When a stereoscopic display is performed, in order to make Part B display black, a separate data line for inputting signals is needed to be added for Part B, which would make the structure complex.

Preferably, the signals input through the data lines are alternating signals with alternatively changed level, which enables a drain current entering Part B to be neutralized in certain degree and reduces light leakage of Part B.

In one embodiment, if a drain current from the first part to the second part (i.e., between Part A and Part B) of the pixel is too high, a black image is input once for every several frames of images so as to avoid light leakage of the second part (Part B).

In one embodiment, when the black image is input, all of the first gate lines and the second gate lines are input with a higher level, and the data lines are input with black image signal, so as to have the whole screen refreshed to be a black image in a very short time without being perceived by one's eyes.

The above-mentioned first part (Part A) and the second part (Part B) constitute a sub-pixel, when the planar display (two-dimensional display) is performed, the first part and the second part of the sub-pixel display according to the same image signal; while the stereoscopic display (three-dimensional display) is performed, the first part of the sub-pixel displays according to corresponding image signal, while the second part of the sub-pixel displays black so as to function as a black matrix (blocking bar).

The embodiments of the present invention also provide a display panel, which comprises the pixel structure as described above and the sub-pixels are arranged in a matrix. In the display panel, the first parts and the second parts of the plurality of sub-pixels are respectively arranged in rows, wherein the rows consisting of the first parts are alternatively arranged with the rows consisting of the second parts.

Examples of the display panel according to the embodiments of the present invention comprise, but not limited to, a liquid crystal display panel and an organic electroluminescence display panel.

In one example, the display panel is a liquid crystal display panel. Each sub-pixel structure of the liquid crystal display panel comprises a pixel electrode, wherein the pixel electrode of the first part of each sub-pixel structure is connected with the data line through the thin film transistor, and the pixel electrode of the second part of each sub-pixel structure is connected with the pixel electrode of the first part through the thin film transistor.

When the liquid crystal display panel operates in a planar display mode, the gate line controlling the first part of the sub-pixel structure is input with a higher level, therefore, data signals for display are input to the pixel electrode of the first part through the data line, and the pixel electrode and a common electrode produce a corresponding electric field for driving the liquid crystals rotate thereby performing corresponding display. Meanwhile the circuit C is also input with a higher level, therefore, the second TFT which connects the first part and the second part of the sub-pixel is also turned on, and the pixel electrode of the second part of the sub-pixel structure also receives corresponding display signals to drive the liquid crystals rotate and perform corresponding display. When the liquid crystal display panel operates in a stereoscopic display mode, the first part of each sub-pixel displays in a similar manner as that in the planar display condition. However, the circuit C is input with a lower level to turn off the second TFT. As a result, there is no display signal for the second part of respective sub-pixels and the second part keeps displaying black. As mentioned above, the second parts of sub-pixels are arranged in rows hence function as a black matrix (blocking bar).

In another example, the display panel is an organic electroluminescence display panel. Each part (the first part and the second part) of the sub-pixel structure of the organic electroluminescence display panel comprises a light emitting diode. The pixel electrode (anode electrode or cathode electrode) of the light emitting diode in the first part of each sub-pixel structure is connected with the data line through the thin film transistor, and the pixel electrode of the light emitting diode of the second part in each sub-pixel structure is connected with the pixel electrode of the light emitting diode in the first part through the thin film transistor.

The principles of the planar display and the stereoscopic display for the organic electroluminescence display panel are similar with those for the above-mentioned liquid crystal display panel. Therefore, in the stereoscopic display, the second part of respective pixels has no display signal thus displays black, whereby the second parts arranged in rows function as a black matrix (blocking bar).

Though only four sub-pixels are shown in FIG. 1, the number of the sub-pixels in the pixel structure or the display panel according to the embodiments of the present invention is not limited to be four and it may be any number greater than or equal to two. Only two first gate lines, two second gate lines and two data lines are shown in FIG. 1, however, the number of each signal line is not limited. Further, the respective sub-pixels may be color sub-pixels corresponding to different colors, such as, red sub-pixels, green sub-pixels and blue sub-pixels.

According to the above descriptions, the embodiments of the present invention may provide at least the following structure and method:

(1) A pixel structure, comprising a plurality of sub-pixels, and a plurality of gate lines and a plurality of data lines that are crossed with each other, wherein the gate lines comprise a plurality of first gate lines and a plurality of second gate lines, each sub-pixel comprises a first part and a second part, and each sub-pixel comprises a first thin film transistor and a second thin film transistor, the first part is connected to a corresponding data line through the first thin film transistor, a gate of the first film transistor is connected to a corresponding first gate line, the first part and the second part of each sub-pixel are connected with each other through the second thin film transistor, and a gate of the second film transistor is connected to a corresponding second gate line.

(2) The pixel structure according to (1), wherein the second gate lines used for each sub-pixel in the pixel structure are electrically connected with one another through a wire.

(3) The pixel structure according to (1) or (2), wherein in a planar display mode, the second gate lines are provided with a higher level, so as to make the second thin film transistor in each sub-pixel turned on.

(4) The pixel structure according to (1) or (2), wherein in a stereoscopic display mode, the second gate lines are provided with a lower level, so as to make the second thin film transistor in each the sub-pixel turned off.

(5) The pixel structure according to any of (1)-(4), wherein, upon switch from a planar display mode to a stereoscopic display mode, a data signal is provided through the data lines so that both of the first part and the second part of each sub-pixel display black.

(6) The pixel structure according to any of (1)-(5), wherein the sub-pixels each have a structure of normal black mode.

(7) The pixel structure according to any of (1)-(6), wherein the signals input through the data lines are alternating signals with alternatively changed level.

(8) The pixel structure according to any of (1)-(7), wherein the first part and the second part of respective sub-pixel each comprises a pixel electrode, the pixel electrode of the first part is connected to the corresponding data lines through the first thin film transistor, and the pixel electrode of the second part is connected to the pixel electrode of the first part through the second thin film transistor.

(9) A control method for the pixel structure according to any of (1)-(8), comprising:

in a planar display mode, a higher level is provided through the second gate line to turn on the second thin film transistor in each sub-pixel, so as to enable the first part and the second part of each sub-pixel to display the same content input from the data lines;

upon switch from the planar display mode to a stereoscopic display mode, a black image is provided through the data lines, so that the first part and the second part of each sub-pixel display black; and in the stereoscopic display mode, a lower level is provided through the second gate line to turn off the second thin film transistor of each sub-pixel, so as to enable the first part of each sub-pixel to display content input from the data lines, while the second part keeps displaying black.

(10) The control method according to (9), wherein the signals input through the data lines are alternating signals with alternatively changed level.

(11) The control method according to (9) or (10), wherein when the black image is provided, all of the first gate lines and the second gate lines are provided with higher levels and the data lines are provided with black image signals.

(12) The control method according to any of (9)-(11), wherein the black image is input once for every several frames of images so as to avoid light leakage of the second part.

(13) A display panel, comprising the pixel structure according to any of (1)-(8), wherein the plurality of sub-pixels are arranged in a matrix, and the first parts and the second parts of the plurality of sub-pixels are respectively arranged in rows, and the rows consisting of the first parts are alternatively arranged with the rows consisting of the second parts.

(14) The display panel according to (13), wherein the display panel is a liquid crystal display panel or an organic electroluminescence display panel.

With the above-mentioned configuration, compared with the prior art, the pixel structure according to the embodiments of the present invention has lower cost and easier control method, and can effectively improve the effect of stereoscopic display. Further, as the pixels used for constituting the black matrix need to be driven separately, switching of the pixels part between the planar display mode and the stereoscopic display mode may be controlled just by the circuit C connected with the respective second gate lines, and therefore, the configuration can be simplified and a scanning rate of the gate lines can be increased.

What is claimed is:

1. A pixel structure of a liquid crystal panel, comprising a plurality of sub-pixels, and a plurality of gate lines and a plurality of data lines that are crossed with each other, wherein the gate lines comprise a plurality of first gate lines and a plurality of second gate lines, each sub-pixel comprises a first part and a second part, and each sub-pixel comprises a first thin film transistor and a second thin film transistor, the first part is connected to a corresponding data line through the first thin film transistor, a gate of the first film transistor is connected to a corresponding first gate line, the first part and the second part of each sub-pixel are connected with each other through the second thin film transistor, and a gate of the second film transistor is connected to a corresponding second gate line, wherein all of the second gate lines used for each sub-pixel in the pixel structure are electrically connected with one another through a wire, wherein in a planar display mode, upon the first gate lines being scanned, all of the second gate lines are always input with a higher level through the wire, so as to make the second thin film transistor in each sub-pixel turned on, wherein in a stereoscopic display mode, the second gate lines are provided with a lower level, so as to make the second thin film transistor in each the sub-pixel turned off, and wherein, upon switch from the planar display mode to the stereoscopic display mode, a data signal is provided through the data lines so that both of the first part and the second part of each sub-pixel display black.

2. The pixel structure according to claim 1, wherein the sub-pixels each have a structure of normal black mode.

3. The pixel structure according to claim 1, wherein the signals input through the data lines are alternating signals with alternatively changed level.

4. The pixel structure according to claim 1, wherein the first part and the second part of respective sub-pixel each comprises a pixel electrode, the pixel electrode of the first part is connected to the corresponding data lines through the first thin film transistor, and the pixel electrode of the second part is connected to the pixel electrode of the first part through the second thin film transistor.

5. A liquid crystal display panel, comprising the pixel structure according to claim 1, wherein the plurality of sub-pixels are arranged in a matrix, and the first parts and the second parts of the plurality of sub-pixels are respectively arranged in rows, and the rows consisting of the first parts are alternatively arranged with the rows consisting of the second parts.

6. The pixel structure according to claim 1, wherein the plurality of sub-pixels are arranged in a matrix, and the first parts and the second parts of the plurality of sub-pixels are respectively arranged in rows, and the rows consisting of the first parts are alternatively arranged with the rows consisting of the second parts.

7. The pixel structure according to claim 6, wherein each of the second gate lines is connected with the second thin film transistors for the sub-pixels in a same row.

* * * * *